United States Patent
Hsu et al.

(10) Patent No.: US 6,762,063 B2
(45) Date of Patent: Jul. 13, 2004

(54) METHOD OF FABRICATING NON-VOLATILE FERROELECTRIC TRANSISTORS

(75) Inventors: Sheng Teng Hsu, Camas, WA (US); Fengyan Zhang, Vancouver, WA (US); Tingkai Li, Vancouver, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 0 days.

(21) Appl. No.: 10/395,368

(22) Filed: Mar. 24, 2003

(65) Prior Publication Data

US 2003/0173600 A1 Sep. 18, 2003

Related U.S. Application Data

(62) Division of application No. 09/783,815, filed on Feb. 13, 2001, now abandoned.

(51) Int. Cl.[7] .............................................. H01L 21/00
(52) U.S. Cl. ........................... 438/3; 438/201; 438/211
(58) Field of Search ............................ 438/3, 201, 211, 438/240, 257, 266; 257/295, 310, 315, 316

(56) References Cited

U.S. PATENT DOCUMENTS 6,011,285 A * 1/2000 Hsu et al. .................. 257/295
6,194,752 B1 * 2/2001 Ogasahara et al. ......... 257/295

* cited by examiner

Primary Examiner—Long Pham
Assistant Examiner—Hoai Pham
(74) Attorney, Agent, or Firm—David C. Ripma; Matthew D. Rabdau

(57) ABSTRACT

A method of fabricating a non-volatile ferroelectric memory transistor includes forming a bottom electrode; depositing a ferroelectric layer over an active region beyond the margins of the bottom electrode; depositing a top electrode on the ferroelectric layer; and metallizing the structure to form a source electrode, a gate electrode and a drain electrode. A non-volatile ferroelectric memory transistor includes a bottom electrode formed above a gate region, wherein the bottom electrode has a predetermined area within a peripheral boundary; a ferroelectric layer extending over and beyond the bottom electrode peripheral boundary; and a top electrode formed on said ferroelectric layer.

23 Claims, 2 Drawing Sheets

METHOD OF FABRICATING NON-VOLATILE FERROELECTRIC TRANSISTORS

CROSS REFERENCE TO RELATED APPLICATIONS

This application is a divisional of application Ser. No. 09/783,815, filed Feb. 13, 2001 now abandoned, entitled "MFMOS/MFMS Non-Volatile Memory Transistors and Method of Making Same," invented by Sheng Teng Hsu et al.

FIELD OF THE INVENTION

This invention relates to ferroelectric non-volatile integrated circuits, and specifically to a simplified fabrication technique which minimizes etching-induced ferroelectric stack damage.

BACKGROUND OF THE INVENTION

A gate stack of a state-of-the-art ferroelectric (FE) memory transistor includes formation of a self-aligned FE stack, which includes deposition and etching of a top electrode material, the ferroelectric material, and a bottom electrode material. There are some serious problems associated with state-of-the-art techniques, which result in a less than desirable yield, such as re-deposition of etched and masking material on the structure, usually as a result of etching the top electrode material, the FE material and the bottom electrode material to form the FE self-aligned stack. Additionally, plasma etching of the FE material may damage the non-volatile properties of the material, which property cannot be restored completely.

SUMMARY OF THE INVENTION

A method of fabricating a non-volatile ferroelectric memory transistor includes preparing a silicon substrate, including forming an active region on the substrate; implanting ions to form a source region and a drain region in the active region; forming a bottom electrode; depositing a ferroelectric layer over the active region; depositing a top electrode; depositing an insulating oxide layer over the active region; and metallizing the structure to form a source electrode, a gate electrode and a drain electrode.

A non-volatile ferroelectric memory transistor includes a silicon substrate having an active region formed thereon; a source region and a drain region formed about a gate region in the active region; a bottom electrode formed above the gate region, wherein the bottom electrode has a predetermined area within a peripheral boundary; a ferroelectric layer extending over and beyond the bottom electrode peripheral boundary; a top electrode formed on the ferroelectric layer; an insulating oxide layer; and a source electrode, a gate electrode and a drain electrode.

An object of the invention is to fabricate a ferroelectric non-volatile memory transistor which does not require gate stack etching.

A further object of the invention is to fabricate a ferroelectric non-volatile memory transistor with minimal etching-induced damage.

Another object of the invention is to provide a fabrication process for a ferroelectric non-volatile memory transistor which is less complex than prior art techniques.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENT

The ferroelectric memory transistor of the invention may be formed on a silicon-on-insulator (SOI) substrate, such as Separation by IMplantation of Oxygen (SIMOX), or, it may be formed in a bulk silicon substrate. The description herein will concentrate on the formation of the structure on a bulk silicon substrate, however, as used herein, "silicon substrate" refers to either a SOI substrate or to a bulk silicon substrate.

The method of the invention overcomes the problems associated with etching to form a self-aligned ferroelectric (FE) gate stack, and to also overcome the problems associated with etching-induced damage. The fabrication method of the invention for a FE non-volatile memory transistor does not require etching of the FE material of the gate stack. Further, the top electrode and the bottom electrode do not need to be self-aligned.

Figure 1:
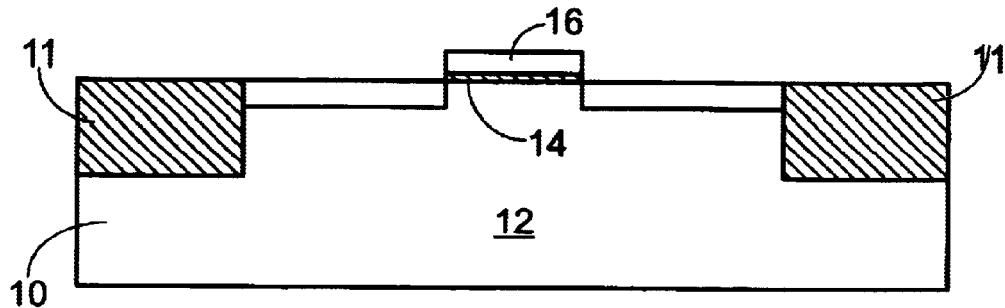
FIGS. 1–4 depict steps in the fabrication process of the invention for a MFMOS FE non-volatile memory transistor.

Referring initially to FIG. 1, the process sequence begins with a substrate 10. As previously noted, this may be a bulk or SOI substrate. State-of-the-art processes are followed for device isolation, with shallow trench isolation (STI) being is used as the preferred technique for device isolation, resulting in the formation of oxide areas 11. Implantation of Boron ions, at a dose of about $1 \cdot 10^{12}$ cm$^{-2}$ to $5 \cdot 10^{13}$ cm$^{-2}$, and at an energy level of 30 keV to 60 keV results in the formation of p-well 12, forming an active region on substrate 10. A gate region is oxidized, resulting in a gate oxide 14, when fabricating a metal-ferro-metal oxide semiconductor (MFMOS) transistor. As will be explained later herein, a surface channel is formed when fabricating a metal-ferro-metal semiconductor (MFMS) transistor. A bottom electrode 16 is deposited by CVD. Bottom electrode 16 is preferably formed of Iridium, deposited to a thickness of between about 100 nm and 200 nm. A layer of photoresist is applied to the desired areas, and bottom electrode 16 is etched, leaving sufficient bottom electrode material to cover a gate region. Bottom electrode 16 has a predetermine area located within a peripheral boundary.

Arsenic ions are implanted at a dose of about $1 \cdot 10^{15}$ cm$^{-2}$ to $3 \cdot 10^{15}$ cm$^{-2}$, and at an energy level of 20 keV to 40 keV, to form a source region 18 and a drain region 20, which are located about a gate region, resulting in the structure depicted in FIG. 1.

Figure 2:
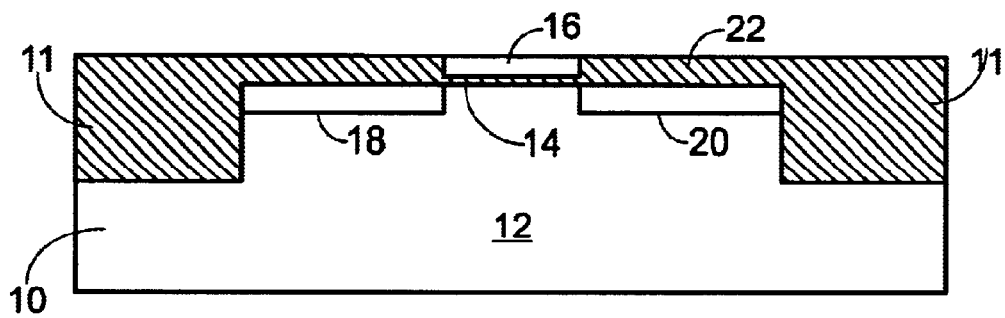

An oxide layer 22 is formed by chemical vapor deposition (CVD) to a thickness of between about 200 nm and 400 nm, which is thicker than that of bottom electrode 16. Oxide layer 22 is thinned by chemical-mechanical polishing (CMP) to the upper surface of bottom electrode 16, exposing the bottom electrode, as shown in FIG. 2.

Figure 3:
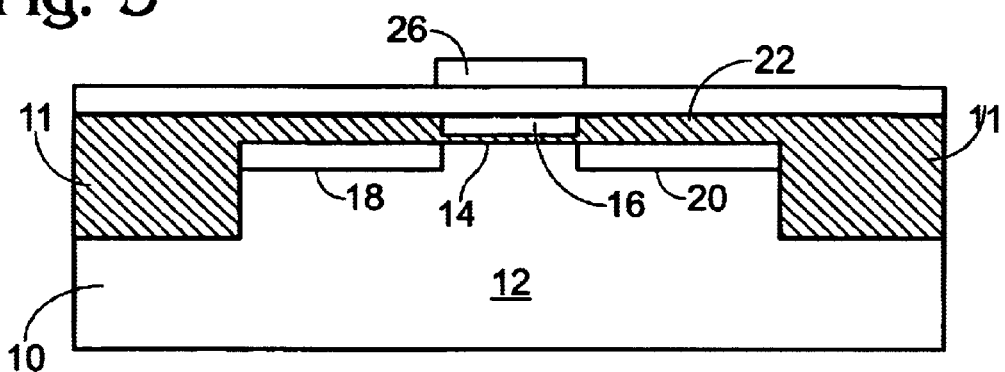

Referring to FIG. 3, a FE layer 24 is formed by CVD to a thickness of between about 100 nm and 400 nm. The FE material may be any of the following: Pb(Zr, Ti)O$_3$ (PZT), SrBi$_2$Ta$_2$O$_9$ (SBT), Pb$_5$Ge$_3$O$_{11}$, BaTiO$_3$, or LiNbO$_3$. A top electrode 26, preferably formed of Platinum, is deposited by CVD to a thickness of between about 100 nm and 300 nm. Photoresist is applied to specific regions of the structure, and the top electrode is etched, resulting in the structure shown in FIG. 3. Using the method of the invention, the selectivity of etching of top electrode 26 vs. FE layer 24 is not critical.

Figure 4:
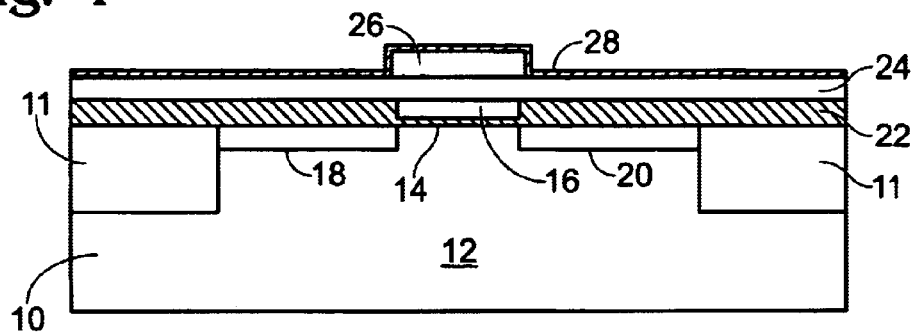
Figure 5:
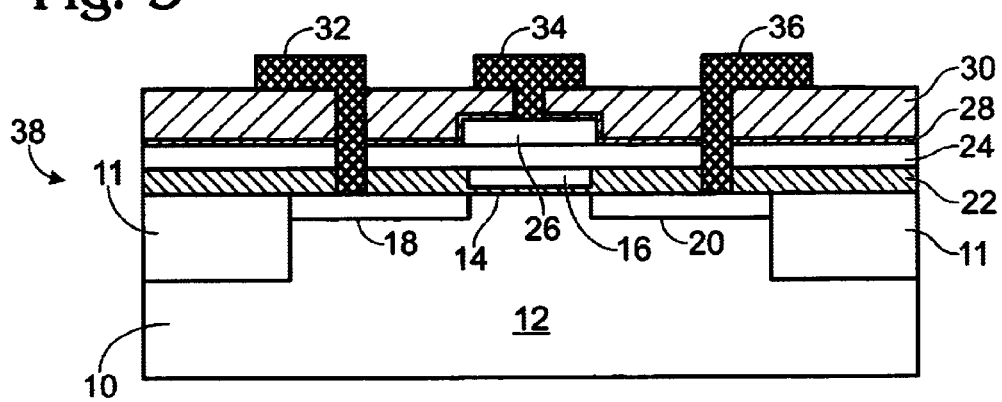
FIG. 5 depicts a MFMOS FE non-volatile memory transistor constructed according to the invention.

Turning to FIG. 4, a barrier insulation layer 28 is deposited by CVD. A material such as TiO$_2$ is suitable for this layer, if required, and may be deposited to a thickness of between about 10 nm and 30. Barrier insulation layer 28 is provided to stop the diffusion of H$_2$ into the FE layer during annealing. An oxide layer 30 is next deposited by CVD. Photoresist is applied prior to etching of contact holes in the insulating oxide. The structure is then metallized, and then etched, forming source electrode 32, gate electrode 34, and drain electrode 36, resulting in the final MFMOS memory transistor structure shown at 38 in FIG. 5.

Figure 6:
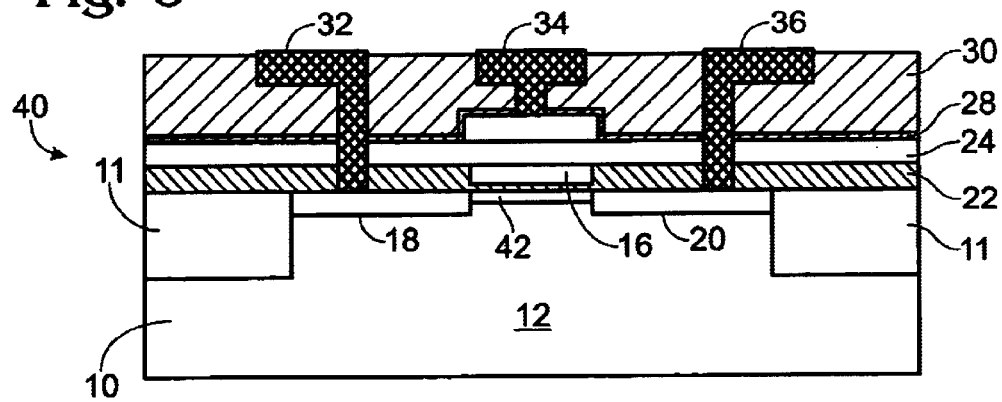
FIG. 6 depicts a MFMS FE non-volatile memory transistor constructed according to the invention.

Referring to FIG. 6, similar fabrication processes may be applied to formation of a MFMS non-volatile transistors, shown generally at 40. In this instance, however, a surface channel n-layer 42 is formed in place of gate oxide layer 14 in FIGS. 1–5. Surface channel 42 is formed by implantation of Arsenic ions, at a dose of about 1·10$^{11}$ cm$^{-2}$ to 5·10$^{12}$ cm$^{-2}$, and at an energy level of about 15 keV to 30 keV, resulting in a n-layer between p-well 12 and bottom electrode 16.

As depicted in the drawings, top electrode 26 and bottom electrode 16 are not self-aligned. When the electrodes are partially overlapped, as in the embodiments of the invention, the effective remnant charge is reduced by A$_{OVERLAP}$/A$_{BOT}$, where A$_{OVERLAP}$ is the area of overlap between top electrode 26 and bottom electrode 16, and A$_{BOT}$ is the area of bottom electrode 16.

When the top electrode is larger than the bottom electrode, the bottom electrode is generally completely covered by the top electrode, and the effective remnant charge is the same as that of a self-aligned gate stack of the same size electrodes. The top electrode may also cover portions of source region 18 and/or drain region 20, and the charge on the FE material will induce a charge on the source/drain junction. This induced charge makes the source region and/or drain region more conductive when the memory cell is programmed to a high conductive state, and less conductive when the memory cell is programmed to a low conductive state. Thus, this form of overlap does not produce any undesirable effects.

While contact etching has to extend through FE layer 24, the contact via is located a short distance laterally away from bottom electrode 16, and, because the etched area is relatively small, any plasma etching damage is minimal. The method of the invention eliminates the need to etch the FE layer for a self-aligning process. The only etching which occurs to the FE layers if the formation of via holes, which is quite minimal, and not likely to result in any loss of non-volatile properties in the FE layer.

Thus, a method and structure for a MFMOS/MFMS non-volatile memory transistor having a simplified and less damaging etching process has been disclosed. It will be appreciated that further variations and modifications thereof may be made within the scope of the invention as defined in the appended claims.

We claim:

1. A method of fabricating a non-volatile ferroelectric memory transistor, comprising:

preparing a silicon substrate, including forming an active region on the substrate;
implanting ions to form a source region and a drain region in the active region;
fabricating a gate stack including:
   forming a bottom electrode on the active region between the drain region and the source region;
   depositing a ferroelectric layer over the active region on the bottom electrode, which ferroelectric layer extends over the source region and the drain region;
   depositing a top electrode on the ferroelectric layer;
depositing an insulating oxide layer over the active region; and
metallizing the structure to form a source electrodes connected to the source region, a gate electrode connected to the gate stack and a drain electrode connected to the drain region.

2. The method of claim 1 wherein said preparing includes forming a gate oxide layer in a gate region.

3. The method of claim 1 wherein said preparing includes forming a surface channel in a gate region.

4. The method of claim 3 wherein said forming a surface channel region includes forming an n-region by implantation of Arsenic ions, at a dose of about 1·10$^{11}$ cm$^{-2}$ to 5·10$^{12}$ cm$^{-2}$, and at an energy level of 15 keV to 30 keV.

5. The method of claim 1 wherein said forming a bottom electrode includes chemical vapor deposition of a layer of Iridium, deposited to a thickness of between about 100 nm and 200 nm, and which further includes etching the Iridium layer to form a bottom electrode of a predetermined area.

6. The method of claim 5 which further includes chemical vapor deposition of oxide to a thickness of between about 200 nm and 400 nm, and thinning the oxide layer by chemical mechanical polishing to the upper surface of bottom electrode, thereby exposing the upper surface of the bottom electrode.

7. The method of claim 1 wherein said implanting ions includes implanting Arsenic ions at a dose of about 1·10$^{15}$ cm$^{-2}$ to 3·10$^{15}$ cm$^{-2}$, and at an energy level of 20 keV to 40 keV.

8. The method of claim 1 wherein said depositing a ferroelectric layer includes depositing a ferroelectric material by chemical vapor deposition to a thickness of between about 100 nm and 400 nm.

9. The method of claim 8 wherein said depositing includes depositing an ferroelectric material taken from the group of ferroelectric materials consisting of Pb(Zr, Ti)O$_3$ (PZT), SrBi$_2$Ta$_2$O$_9$ (SBT), Pb$_5$Ge$_3$O$_{11}$, BaTiO$_3$, and LiNbO$_3$.

10. The method of claim 1 wherein said depositing a top electrode includes depositing a layer of Platinum, by a deposition process taken from the group of processes consisting of chemical vapor deposition and sputtering to a thickness of between about 100 nm and 300 nm, masking the desired area of the top electrode, and etching the unmasked material.

11. The method of claim 10 wherein said depositing a top electrode includes forming a top electrode having an area greater than the area of the bottom electrode.

12. The method of claim 1 which further includes forming a barrier insulation layer which extends over the ferroelectric layer and the top electrode.

13. The method of claim 12 wherein said forming a barrier insulation layer includes depositing a layer of TiO$_2$ to a thickness of between about 10 nm and 30 nm.

14. A method of fabricating a non-volatile ferroelectric memory transistor, comprising:

preparing a silicon substrate, including forming an active region on the substrate;

forming a gate region on the substrate having a gate oxide layer therein;

implanting ions to form a source region and a drain region in the active region, wherein the source region and the drain region are self-aligned with the gate region;

forming a bottom electrode on the gate region which is self aligned with the gate region;

depositing a ferroelectric layer on the bottom electrode and extending over the active region;

depositing a top electrode on the ferroelectric layer;

depositing an insulating oxide layer over the active region; and metallizing the structure to form a source electrode connected to the source region, a gate electrode connected to the top electrode and a drain electrode connected to the drain region.

15. The method of claim 14 which includes forming a n-type surface channel region by implantation of Arsenic ions, at a dose of about $1 \cdot 10^{11}$ cm$^{-2}$ to $5 \cdot 10^{12}$ cm$^{-2}$, and at an energy level of 15 keV to 30 keV.

16. The method of claim 14 wherein said forming a bottom electrode includes chemical vapor deposition of a layer of Iridium, deposited to a thickness of between about 100 nm and 200 nm, etching the Iridium layer to form a bottom electrode of a predetermined area; depositing a layer of oxide by chemical vapor deposition to a thickness of between about 200 nm and 400 nm; and thinning the oxide layer by chemical mechanical polishing to the upper surface of bottom electrode, thereby exposing the upper surface of the bottom electrode.

17. The method of claim 14 wherein said depositing a top electrode includes depositing a layer of Platinum, by a deposition process taken from the group of processes consisting of chemical vapor deposition and sputtering to a thickness of between about 100 nm and 300 nm, masking the desired area of the top electrode, and etching the unmasked material.

18. The method of claim 17 wherein said depositing a top electrode includes forming a top electrode having an area greater than the area of the bottom electrode.

19. The method of claim 17 wherein said depositing a top electrode includes forming a top electrode having an area which overlaps the source region and the drain region.

20. The method of claim 14 which further includes forming a barrier insulation layer which extends over the ferroelectric layer and the top electrode.

21. The method of claim 20 wherein said forming a barrier insulation layer includes depositing a layer of TiO$_2$ to a thickness of between about 10 nm and 30 nm.

22. The method of claim 14 wherein said depositing a ferroelectric layer includes depositing a ferroelectric material by chemical vapor deposition to a thickness of between about 100 nm and 400 nm.

23. The method of claim 22 wherein said depositing includes depositing an ferroelectric material taken from the group of ferroelectric materials consisting of Pb(Zr, Ti)O$_3$ (PZT), SrBi$_2$Ta$_2$O$_9$ (SBT), Pb$_5$Ge$_3$O$_{11}$, BaTiO$_3$, and LiNbO$_3$.

* * * * *